(12) United States Patent
Sutardja et al.

(10) Patent No.: US 8,937,511 B2
(45) Date of Patent: Jan. 20, 2015

(54) FREQUENCY SCALING OF VARIABLE SPEED SYSTEMS FOR FAST RESPONSE AND POWER REDUCTION

(71) Applicant: Marvell World Trade Ltd., St. Michael (BB)

(72) Inventors: Pantas Sutardja, Los Gatos, CA (US); Sehat Sutardja, Los Altos Hills, CA (US)

(73) Assignee: Marvell World Trade Ltd., St. Michael (BB)

( * ) Notice: Subject to any disclaimer, the term of this patent is extended or adjusted under 35 U.S.C. 154(b) by 150 days.

(21) Appl. No.: 13/681,737

(22) Filed: Nov. 20, 2012

(65) Prior Publication Data
US 2013/0127550 A1 May 23, 2013

Related U.S. Application Data

(60) Provisional application No. 61/562,666, filed on Nov. 22, 2011.

(51) Int. Cl.
*H03K 3/03* (2006.01)
*H03K 3/02* (2006.01)
*G06F 1/08* (2006.01)
*G06F 1/32* (2006.01)

(52) U.S. Cl.
CPC .. *H03K 3/02* (2013.01); *G06F 1/08* (2013.01); *G06F 1/324* (2013.01); *G06F 1/3296* (2013.01)
USPC ............................................. 331/57; 327/299

(58) Field of Classification Search
USPC ........................................................... 331/57
See application file for complete search history.

(56) References Cited

U.S. PATENT DOCUMENTS

| 5,343,170 | A | 8/1994 | Lee | |
|---|---|---|---|---|
| 6,075,419 | A | 6/2000 | Sun et al. | |
| 7,469,355 | B1 * | 12/2008 | Chong | ........................... 713/600 |
| 7,802,118 | B1 | 9/2010 | Abdalla et al. | |
| 8,044,729 | B2 * | 10/2011 | Chen | ............................... 331/57 |
| 8,373,511 | B2 * | 2/2013 | Kumar et al. | ................... 331/16 |
| 2003/0229816 | A1 * | 12/2003 | Meynard | ....................... 713/600 |
| 2010/0156544 | A1 | 6/2010 | Lee et al. | |

OTHER PUBLICATIONS

ARM Limited: Cortex-AB Technical Reference Manual—Revision r2p3—Chapter 10; Oct. 6, 2008; 39 pages.
PCT International Search Report for related PCT Application No. PCT/US2012/066257; Apr. 3, 2013; 5 pages.

* cited by examiner

*Primary Examiner* — Joseph Chang (57) ABSTRACT

A system including a plurality of amplifiers configured to generate a clock signal having a frequency. The clock signal is input to a processor. The amplifiers are connected in series. An output of a last one of the amplifiers is fed back to an input of a first one of the amplifiers. Each of the amplifiers has a transconductance. A frequency adjustment module is configured to adjust, based on an activity level of the processor, the frequency of the clock signal by adjusting the transconductance of the amplifiers.

18 Claims, 8 Drawing Sheets

FREQUENCY SCALING OF VARIABLE SPEED SYSTEMS FOR FAST RESPONSE AND POWER REDUCTION

CROSS-REFERENCE TO RELATED APPLICATIONS

This application claims the benefit of U.S. Provisional Application No. 61/562,666, filed on Nov. 22, 2011. The entire disclosure of the above application is incorporated herein by reference.

FIELD

The present disclosure relates generally to power management in computing devices and more particularly to frequency scaling of variable speed systems for fast response and power reduction.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Processors of computing devices including laptop computers, smartphones, and tablets can execute different applications. The power consumed by the computing devices depends on the speed of the processors. The speed of the processors can be varied depending on the applications being executed by the processors.

SUMMARY

A system comprises a plurality of amplifiers configured to generate a clock signal having a frequency. The clock signal is input to a processor. The amplifiers are connected in series. An output of a last one of the amplifiers is fed back to an input of a first one of the amplifiers. Each of the amplifiers has a transconductance. A frequency adjustment module is configured to adjust, based on an activity level of the processor, the frequency of the clock signal by adjusting the transconductance of the amplifiers.

In other features, the plurality of amplifiers receives a supply voltage, and the system further comprises a supply voltage control module configured to adjust, based on the activity level of the processor, the transconductance of the amplifiers by adjusting the supply voltage of the plurality of amplifiers.

In other features, each of the amplifiers includes an input configured to receive a control signal to adjust the transconductance of the amplifiers, and the system further comprising a digital-to-analog converter configured to receive data based on the activity level of the processor, and to generate, based on the data, the control signal to adjust the transconductance of the amplifiers.

In other features, the system further comprises a plurality of capacitances and a plurality of switches connected respectively across an output of each of the amplifiers and a common potential. A total capacitance across the output of each of the amplifiers depends on states of the plurality of switches. A capacitor switching module is configured to adjust, based on the activity level of the processor, the transconductance of the amplifiers by controlling the states of the switches.

In other features, the system further comprises a numerically controlled oscillator configured to generate a signal, and to receive, based on the activity level of the processor within a predetermined time period, a plurality of inputs during a plurality of portions of the predetermined time period, where the inputs adjust a frequency of the signal. A gating module is configured to receive the signal generated by the numerically controlled oscillator, and to output the clock signal to the processor in accordance with the signal generated by the numerically controlled oscillator.

In still other features, a system comprises a ring oscillator including a plurality of inverters configured to generate a clock signal having a frequency, where the clock signal is supplied to a processor, and where each of the inverters has a transconductance. A frequency adjustment module is configured to receive an activity level of the processor, and to adjust, based on the activity level of the processor, the frequency of the clock signal by adjusting the transconductance of the inverters.

In other features, the plurality of inverters receives a supply voltage, and the system further comprises a supply voltage control module configured to adjust, based on the activity level of the processor, the transconductance of the inverters by adjusting the supply voltage of the plurality of inverters.

In other features, each of the inverters includes an input configured to receive a control signal to adjust the transconductance of the inverters, and the system further comprises a digital-to-analog converter configured to receive data based on the activity level of the processor, and to generate, based on the data, the control signal to adjust the transconductance of the inverters.

In other features, the system further comprises a plurality of capacitances and a plurality of switches connected respectively across an output of each of the inverters and a common potential, where a total capacitance across the output of each of the inverters depends on states of the plurality of switches. A capacitor switching module is configured to adjust, based on the activity level of the processor, the transconductance of the inverters by controlling the states of the switches.

In other features, the system further comprises a numerically controlled oscillator configured to generate a signal, and to receive, based on the activity level of the processor within a predetermined time period, a plurality of inputs during a plurality of portions of the predetermined time period, where the inputs adjust a frequency of the signal. A gating module is configured to receive the signal generated by the numerically controlled oscillator, and to output the clock signal to the processor in accordance with the signal generated by the numerically controlled oscillator.

In still other features, a method comprises generating a clock signal for a processor using a plurality of inverters connected in series, where the clock signal has a frequency, and where each of the inverters has a transconductance. The method further comprises receiving an activity level of the processor, and adjusting, based on the activity level of the processor, the frequency of the clock signal by adjusting the transconductance of the inverters.

In other features, the method further comprises supplying the plurality of inverters receives a supply voltage, and adjusting, based on the activity level of the processor, the transconductance of the inverters by adjusting the supply voltage of the plurality of inverters.

In other features, the method further comprises converting data indicating the activity level of the processor to a control signal, and adjusting the transconductance of the inverters by supplying the control signal to an input of each of the inverters, where the input of each of the inverters is configured to receive the control signal to adjust the transconductance of the respective inverter.

In other features, the method further comprises connecting a plurality of capacitances and a plurality of switches respectively across an output of each of the inverters and a common potential, where a total capacitance across the output of each of the inverters depends on states of the plurality of switches. The method further comprises adjusting, based on the activity level of the processor, the transconductance of the inverters by controlling the states of the switches.

In other features, the method further comprises generating a signal using a numerically controlled oscillator, and receiving, based on the activity level of the processor within a predetermined time period, a plurality of inputs during a plurality of portions of the predetermined time period, where the inputs adjust a frequency of the signal. The method further comprises outputting the clock signal to the processor in accordance with the signal generated by the numerically controlled oscillator.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein.

DESCRIPTION

The speed of a processor depends on the frequency of a clock signal (clock frequency) supplied to the processor. The present disclosure relates to a voltage controlled oscillator (VCO) that generates the clock signal supplied to the processor. In one embodiment, the VCO adjusts the clock frequency according to the needs of an application being executed by the processor. In another embodiment, the VCO adjusts the clock frequency based on the power consumption and/or voltage drop of a monitored device. The VCO adjusts the clock frequency by varying the transconductance of amplifiers (e.g., inverters) used in the VCO. The transconductance of amplifiers is varied by supplying one or more controlled inputs to the VCO. The controlled inputs include a power supply voltage of the VCO, an output of a digital-to-analog converter (DAC), and/or an input to a switched capacitor bank used in the VCO. The clock frequency may also be controlled using a clock gating system driven by a numerically controlled digital oscillator (NCO) as explained below.

For example, to vary the clock frequency of the VCO, the transconductance of the amplifiers may be initially varied by adjusting a supply voltage of the amplifiers. The supply voltage is adjusted within a predetermined range having a maximum value and a minimum value. After the supply voltage reaches the maximum or the minimum value of the predetermined range, the output of the DAC and/or the input to the switched capacitor bank can be used to further vary the transconductance of the amplifiers. Alternatively, after the supply voltage reaches the maximum or the minimum value of the predetermined range, the clock frequency may be controlled using the clock gating system driven by the NCO.

Figure 1A:
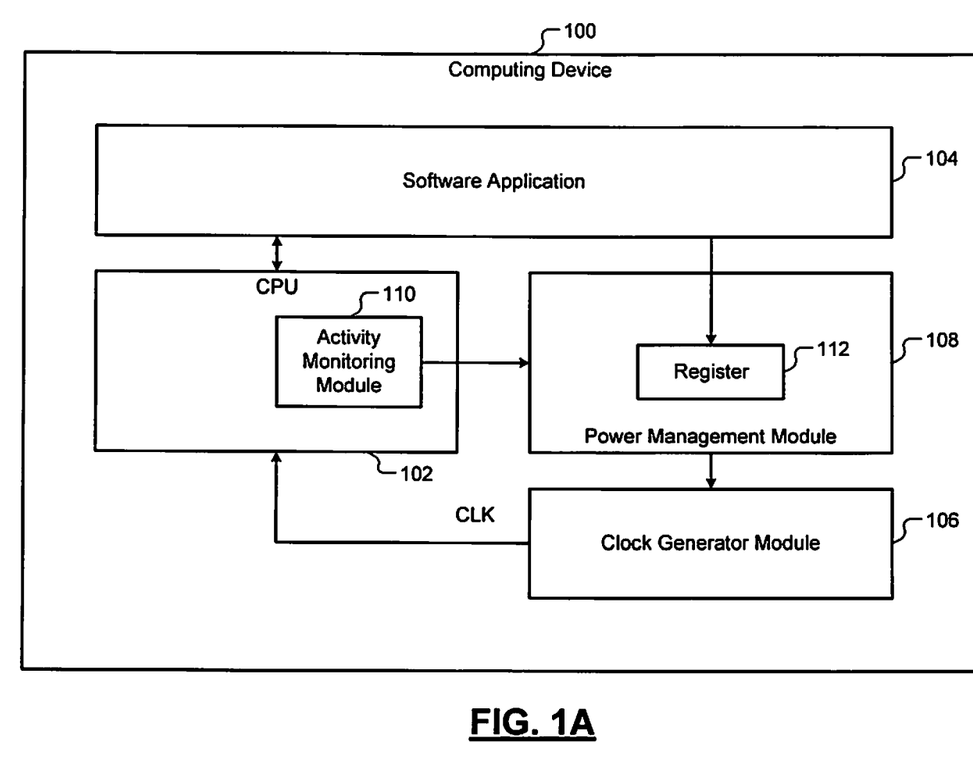
FIG. 1A is a functional block diagram of a computing device according to the present disclosure.

Referring now to FIG. 1A, a computing device 100 employing an automatic CPU speed control system according to the present disclosure is shown. The computing device 100 includes a CPU 102. The CPU 102 executes a software application 104. A clock generator module 106 supplies a clock signal (CLK) having a clock frequency to the CPU 102. The CPU 102 executes the software application 104 at a speed determined by the clock frequency. A power management module 108 manages the power consumption of the CPU 102 by controlling the clock frequency. The clock generator module 106 generates the clock signal according to the controlled inputs supplied by the power management module 108.

An activity monitoring module 110 monitors activity of the CPU 102. For example, the activity monitoring module 110 collects statistical data about the activities of the CPU 102. The power management module 108 receives an input indicating the activity level of the CPU 102 from the activity monitoring module 110. Based on the input, the power management module 108 determines whether the speed of the CPU 102 can be reduced or needs to be increased. Accordingly, the power management module 108 automatically reduces or increases the speed of the CPU 102 by decreasing or increasing the clock frequency.

The software application 104 can override the clock frequency set by the power management module 108. For example, the software application 104 can override the clock frequency set by the power management module 108 by writing a value to a register 112 that increases or decreases the clock frequency by jumping to a new target value. For example, the software application 104 may override the clock frequency set by the power management module 108 when a portion of the code needs to run faster or when the software application 104 knows ahead of time that the software application 104 can slow down.

When the software application 104 issues a speed-up command, the change in the clock frequency will have to be completed before the clock frequency can throttle down again automatically in response to a low activity rate of the CPU 102. When the software application 104 issues a speed reduction command, the reduction in the clock frequency can be negated after a predetermined time period if the power management module 108 senses that the CPU 102 is too busy at the lowered clock frequency.

Figure 1B:
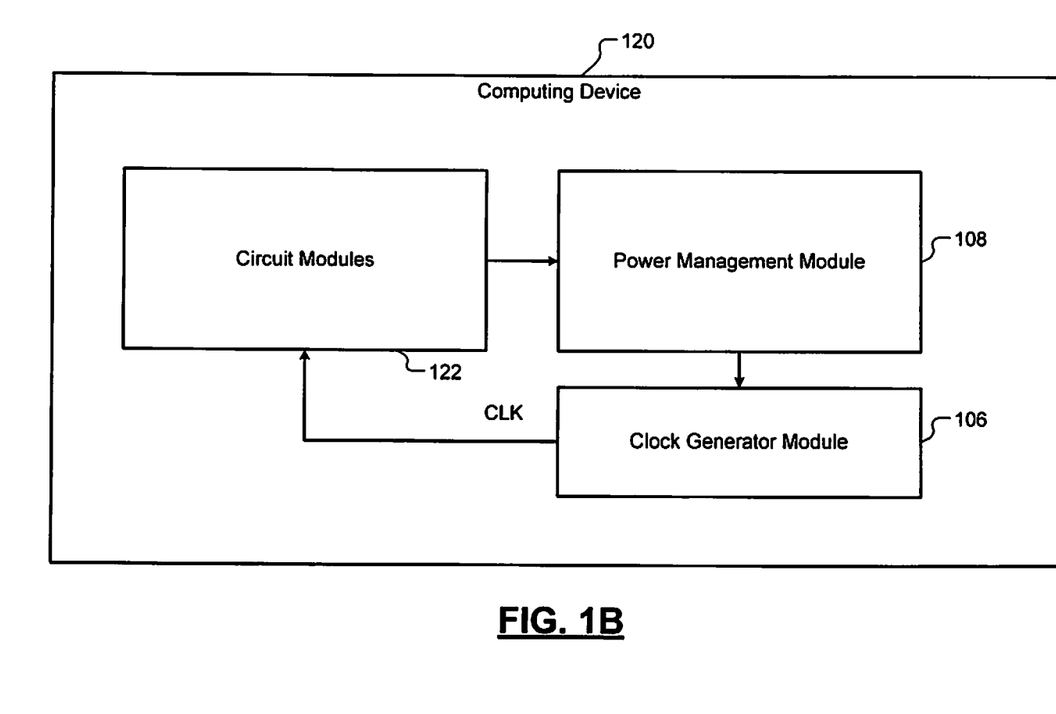
FIG. 1B is a functional block diagram of a computing device according to the present disclosure.

Referring to FIG. 1B, the clock frequency adjustment techniques disclosed herein may be similarly applied to a computing device 120. The computing device 120 includes one or more circuit module(s) 122, the power management module 108 and the clock generator module 106. The circuit module(s) 122 provide power consumption and/or voltage information to the power management module 108. The power management module 108, in turn, uses such information to provide the proper controlled inputs to the clock generator module 106. In response, the clock generator module 106 provides the appropriate clock signal to the circuit module(s) 122.

The clock frequency of the clock signal may be adjusted in a number of ways to account for various scenarios. In one example scenario, the power consumption and/or voltage information relates to a supply voltage for powering the circuit module(s) 122. The power management module 108 monitors the power or voltage level of the supply voltage and reduces the clock frequency accordingly in order to prevent operational failure(s) due to insufficient power or power glitches. Operational failure(s) may happen when the circuit module(s) 122 collectively demand more power than is available, such as, when the circuit module(s) 122 collectively and/or simultaneously engage in high activity levels. Such over-demand for power usually results in a sudden voltage drop or variation in the supply voltage. When the sudden voltage drop or variation exceeds a threshold tolerance level, one or more of the circuit module(s) 122 may fail. Operational failure(s) may also happen when the circuit module(s) 122 engage in clock gating activities (such as powering or de-powering some or all of the circuit module(s) 122) which can result in power variations or glitches. By monitoring the power or voltage level of the supply voltage, the power management module 108 may respond to the voltage drop or variation by directing the clock generator module 106 to lower the clock frequency which, in turn, reduces the activity levels of the circuit module(s) 122, thus minimizing operational failure(s) due to over-demand of power or power glitches. Without the aforementioned adaptive clock frequency adjustment, the computing device 120 would have to be designed to provide adequate built-in margin of error to accommodate worst case scenarios, which typically result in design and/or operational inefficiencies. By having the adaptive clock frequency adjustment, the built-in margin of error may be minimized, thereby resulting in more efficient design and operations.

In another example scenario, the circuit modules 122 provide to the power management module 108 power consumption and/or voltage information relating to the level of consumption by the circuit modules 122. If the power management module 108 determines that the level of consumption has increased (e.g., a voltage increase), which would mean that the activity levels of the circuit modules 122 have also increased, the power management module 108 then directs the clock generator module 106 to increase the clock frequency of the clock signal, thereby accommodating the increased levels of activity of the circuit modules 122.

The aforementioned adaptive clock frequency adjustment may be used in various embodiments. In one embodiment, the computing device 120 includes an end user device, such as, a mobile phone, a tablet, a laptop or the like and the circuit modules 122 include one or more integrated circuits (ICs) or chips. In another embodiment, the computing device 120 includes a system-on-chip (SoC) and the circuit modules 122 include one or more circuit components.

Figure 2:
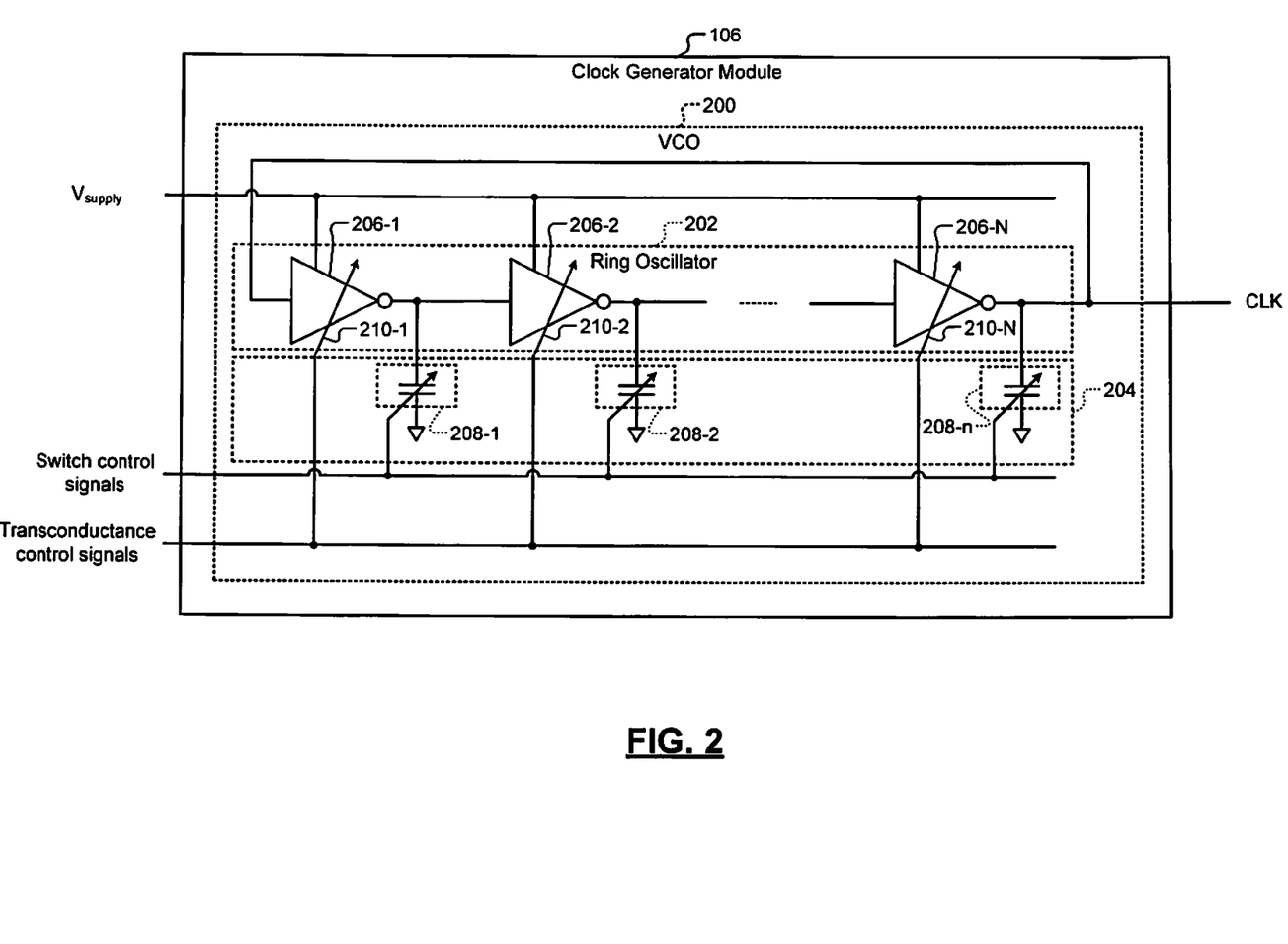
FIG. 2 is a functional block diagram of a voltage controlled oscillator (VCO) according to the present disclosure.

Referring now to FIG. 2, the clock generator module 106 includes a voltage controlled oscillator (VCO) 200 that generates the clock signal. The VCO 200 includes a ring oscillator 202 and a switched capacitor bank 204. For example only, the ring oscillator 202 includes a plurality of inverters 206-1, 206-2, ..., and 206-N (collectively inverters 206), where N is an integer greater than 1. The inverters 206 are connected in series. An output of a last inverter 206-N is fed back to an input of a first inverter 206-1. Other types of amplifiers may be used instead of the inverters 206.

The switched capacitor bank 204 includes a plurality of variable capacitors C1 208-1, C2 208-2, ..., and Cn 208-n (collectively variable capacitors 208), where n is an integer greater than 1. Each variable capacitor 208 may include a plurality of capacitors and a plurality of switches. The switches may include transistors. The plurality of capacitors and the plurality of switches can be arranged in different configurations. Some examples of the configurations are shown in FIG. 3B. A variable capacitor 208 is connected across an output of each inverter 206 and a common reference potential (e.g., ground).

The clock frequency of the VCO 200 can be changed by changing the transconductance of the inverters 206. The transconductance of the inverters 206 can be changed by supplying one or more of a plurality of controlled inputs to the VCO 200 as explained below. Each inverter 206 may include a transconductance control input 210. For example, the inverter 206-1 may include an input 210-1; the inverter 206-2 may include an input 210-2; and so on. The transconductance of an inverter 206 can be changed by supplying a transconductance control signal to the transconductance control input 210 of the inverter 206. The switched capacitor bank 204 allows preset control of the transconductance. The switched capacitor bank 204 can also provide compensation for process variation.

The ring oscillator 202 is responsive to a plurality of controlled inputs. The controlled inputs include a supply voltage $V_{supply}$ of the ring oscillator 202, an output of a high-resolution DAC (see FIG. 3A) including transconductance control signals supplied to the inputs 210 of the inverters 206, and a set of control signals including switch control signals supplied to the variable capacitors 208 to control the switches (see FIG. 3B). The clock frequency can be changed by changing one or more of the controlled inputs.

To change the clock frequency, the supply voltage of the inverters 206 is initially varied until the supply voltage reaches a minimum or maximum value of a predetermined range. Subsequently, one or more of the other controlled inputs (e.g., the transconductance control signals and/or the switch control signals) are utilized to change the clock frequency.

The supply voltage $V_{supply}$ of the ring oscillator 202 may be normally tied to a supply voltage of the CPU 102 (e.g., $V_{dd}$). The supply voltage $V_{supply}$ of the ring oscillator 202 can also be switched to an internally regulated voltage during calibration. Varying the supply voltage $V_{supply}$ of the ring oscillator 202 varies the transconductance of the inverters 206 of the ring oscillator 202.

Initially, the clock frequency can be changed by changing the supply voltage $V_{supply}$ within a predetermined range (e.g., $V_{ddmin}$ to $V_{ddmax}$). After the supply voltage $V_{supply}$ has reached the maximum or the minimum value of the predetermined range (e.g., $V_{ddmin}$ or $V_{ddmax}$), the output of the DAC can be used to vary the transconductance of each of the inverters 206. Alternatively, the switch control signals can be used to change the values of the variable capacitors 208 at the outputs of the inverters 206. Varying the capacitors 208 at the outputs of the inverters 206 varies the transconductance of the inverters 206. As described above, the ring oscillator 202 is used to implement the VCO 200. It should be noted that, based on the disclosure and teaching provided herein, an LC oscillator and other types of oscillators may also be used to implement the VCO 200.

Figure 3A:
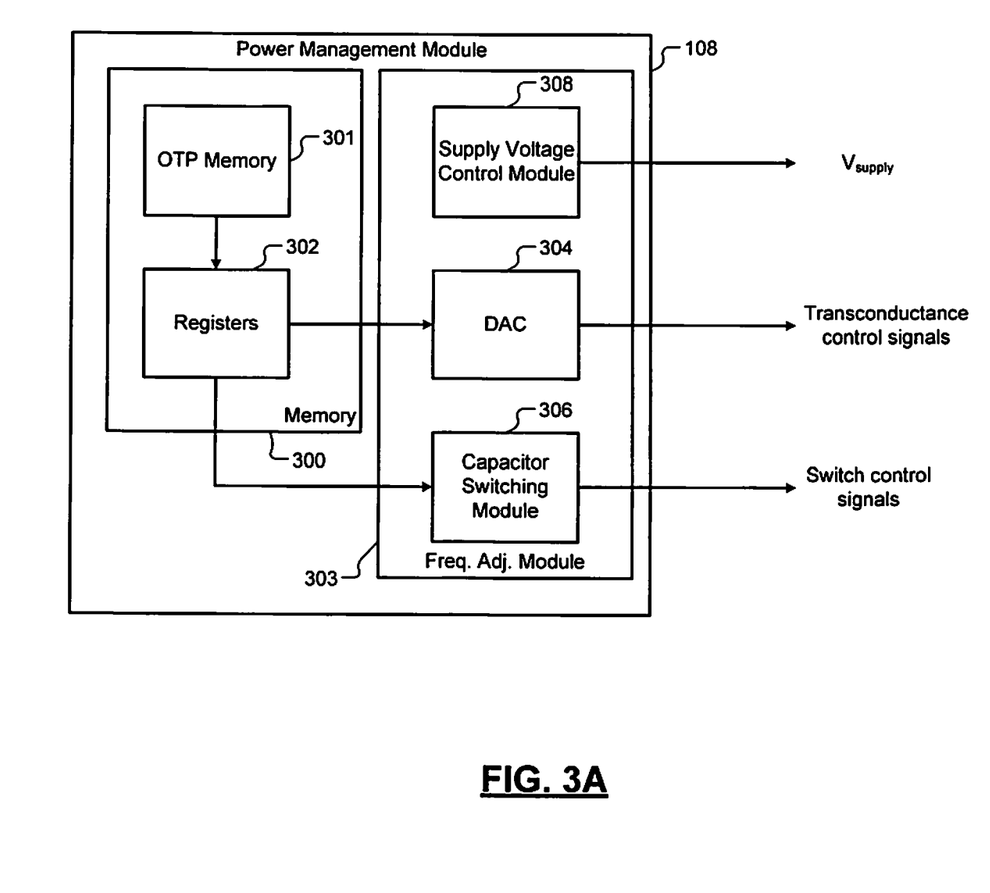
FIG. 3A is a functional block diagram of a power management module according to the present disclosure.
Figure 3B:
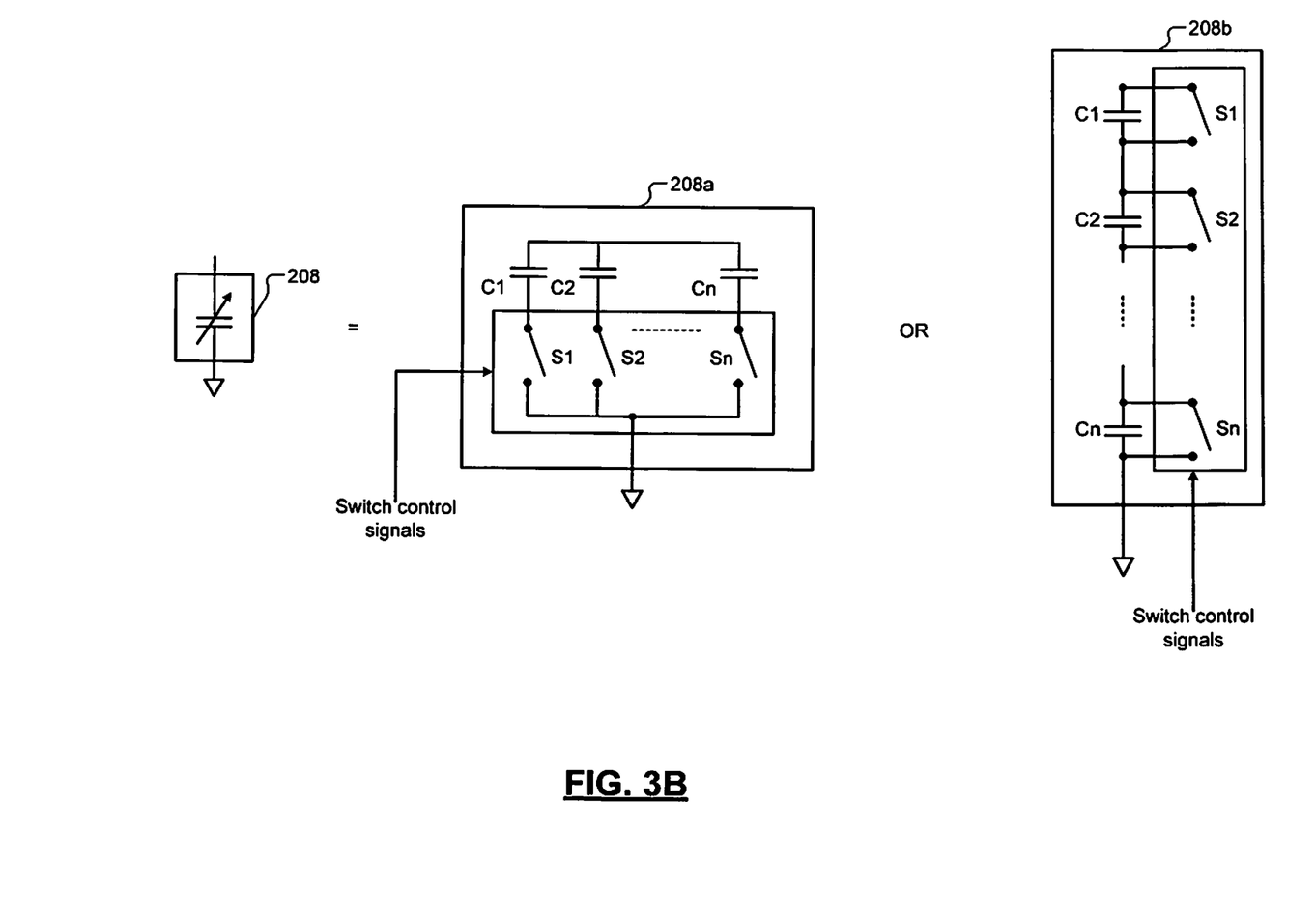
FIG. 3B is a schematic of a switched capacitor bank according to the present disclosure.

Referring now to FIGS. 3A and 3B, additional details of the power management module 108 and the VCO 200 are shown. In FIG. 3A, the power management module 108 includes memory 300 and a frequency adjustment module 303. The frequency adjustment module 303 adjusts the clock frequency by generating one or more of the controlled inputs supplied to the VCO 200. The frequency adjustment module 303 includes a DAC 304, a capacitor switching module 306, and a supply voltage control module 308.

For example only, the memory 300 may include a one-time programmable (OTP) nonvolatile memory (NVM) 301 and a plurality of registers 302. The OTP NVM 301 and the registers 302 store data used to generate one or more of the controlled inputs supplied to the VCO 200. The data may be loaded during initialization (power up) and may be changed based on CPU activity. The DAC 304 and the capacitor switching module 306 use the data to generate the respective controlled inputs for the VCO 200.

For example, the DAC 304 can use the data to generate the transconductance control signals supplied to the inputs 210 of the inverters 206 to control the transconductance of the inverters 206. The capacitor switching module 306 can use the data to generate the switch control signals used to control the switches in the switched capacitor bank 204. The supply voltage control module 308 can use the data to generate the control input $V_{supply}$ to adjust the supply voltage of the VCO 200 within the predetermined range (e.g., $V_{ddmin}$ to $V_{ddmax}$).

In FIG. 3B, each variable capacitor 208 may include a plurality of capacitors and a plurality of switches. The capacitors and switches may be arranged in different ways. For example, in an arrangement 208a, capacitors C1, C2, . . . , and Cn may be respectively connected in series to switches S1, S2, . . . , and Sn, where n is an integer greater than 1. The series combinations of the capacitors and switches are connected in parallel as shown. Alternatively, in an arrangement 208b, capacitors C1, C2, . . . , and Cn are connected in series; and switches S1, S2, . . . , and Sn, are connected across the capacitors C1, C2, . . . , and Cn, respectively. In the arrangements 208a and 208b, the switches S1, S2, . . . , and Sn can be controlled by the switch control signals. By opening and/or closing one or more switches S1, S2, . . . , and Sn, the value of the variable capacitors 208 at the output of each inverter 206 can be varied.

The VCO 200 initializes at power up. Default values to initialize settings to generate the transconductance control signals and the switch control signals can be loaded into the plurality of registers 302 at power up. Alternatively, a time calibration of the VCO 200 can be performed using an automated test equipment (ATE) during manufacture. The one-time programmable (OTP) nonvolatile memory (NVM) 301 may be programmed with calibrated values used to supply preset transconductance control signals and switch control signals at power up. When the VCO 200 initializes at power up, the calibrated values for the transconductance control signals and the switch control signals may be loaded into the plurality of registers 302 from the OTP NVM 301. The calibrated values can override the default values.

The initial setup of the VCO 200 can generate a clock signal that meets setup time requirements of the CPU 102 within a supported $V_{dd}$ and temperature range. Deliberate CPU speed change at a higher frequency range relies mainly on $V_{dd}$ changes. Temperature changes, while related to system activities, may be considered independent since the relationship between the system activities and temperature changes may be too complex to predict. Uncontrolled $V_{dd}$ changes through dynamic or other systematic voltage drops are taken into account by directly affecting the clock frequency.

An activity metric that measures an amount of CPU activity (or inactivity) may be used to control the VCO frequency. For example, the activity monitoring module 110 can monitor idle state of the CPU 102. For example, a Wait-For-Interrupt (WFI) instruction can be used to indicate the idle state of the CPU 102. Counting cycles, however, may not be meaningful if the CPU speed (i.e., the clock frequency) varies. Accordingly, running loops like for (i=0; i<N; ++i) can be avoided, and hardware-based timers can be used instead for waiting.

With this approach, a simple criterion to decide if the CPU 102 has more than a predetermined number of idle states is to count the number of WFI states within a predetermined period. For example, suppose the predetermined period is 1024 clock cycles. Within this predetermined period, suppose the activity monitoring module 110 senses more than say 20 WFI states. The power management module 108 can determine that the CPU 102 is idling a lot, that the clock frequency is too high, and that the clock frequency can be reduced. Conversely, if the number of WFI states within the predetermined period is say less than 10, the power management module 108 can determine that the CPU 102 is idling a little (i.e., the CPU 102 is too busy), that the clock frequency is not too high, and that the clock frequency can be increased. If the number of WFI states within the predetermined period is between 10 and 20, the power management module 108 can keep the clock frequency unchanged.

In general, the power management module 108 can control the clock frequency by defining parameters such as IdleCountInterval, SpeedUpThreshold, and SlowDownThreshold. In the above example, the IdleCountInterval was 1024 clock cycles, the SpeedUpThreshold was greater than or equal to 20 WFI states, and the SlowDownThreshold was less than or equal to 10 WFI states. Additionally, the power management module 108 can use a parameter SlowDownHysterysis to avoid an invalid definition where the SpeedUpThreshold and the SlowDownThreshold cross each other.

The power management module 108 may use a state machine to control the speed of the CPU 102. In response to the activity metric, the state machine can speed up or slow down the CPU 102 (i.e., increase or decrease the clock frequency of the VCO 200). The clock frequency of the VCO 200 is changed first by adjusting the supply voltage $V_{dd}$ of the CPU 102. As long as the supply voltage $V_{dd}$ is between a predetermined minimum value $V_{ddmin}$ and a predetermined maximum value $V_{ddmax}$, the clock frequency of the VCO 200 is controlled by adjusting the supply voltage $V_{dd}$ (e.g., from an external power management integrated circuit).

If $V_{dd}$ value has reached $V_{ddmax}$, no increase in $V_{dd}$ is allowed (except through normal on-chip dynamic swings of $V_{dd}$). When $V_{dd}$ has reached $V_{ddmin}$, any slowdown of the VCO 200 can be performed by adjusting the transconductance control signals of the VCO 200. For example, the frequency of the VCO 200 can be decreased by a programmable setting (e.g., about 20%) defined by a minimum value used by the DAC 304 to generate the transconductance control signals, say FineControlMin.

Figure 4:
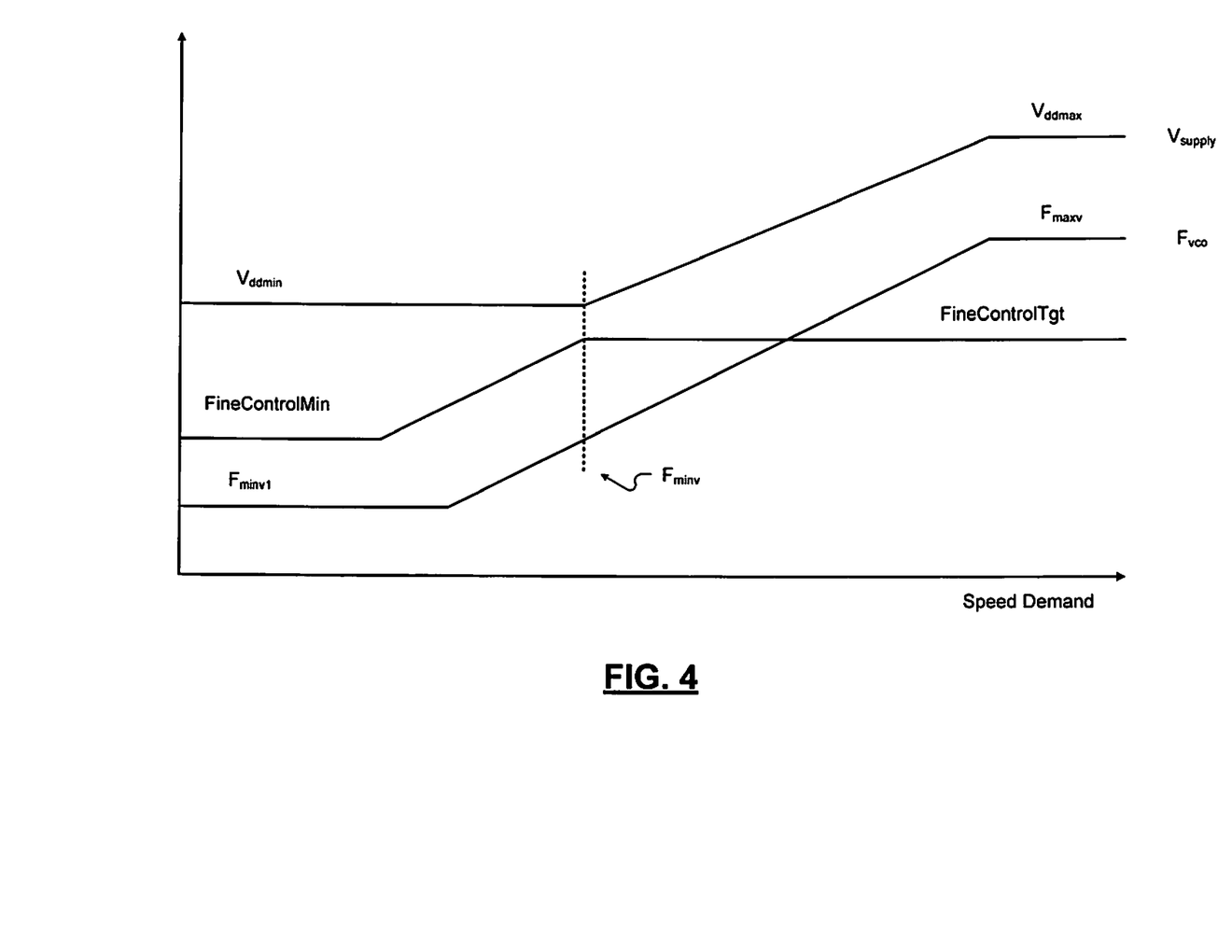
FIG. 4 depicts VCO frequency control as a function of processor speed demand according to the present disclosure.

Referring now to FIG. 4, the VCO frequency control is shown as a function of speed demand. The clock frequency of the VCO 200 is $F_{vco}=F_{maxv}$ when $V_{dd}=V_{ddmax}$ and when the value used to generate the transconductance control signals is a target value, say FineControlTgt. The clock frequency of the VCO 200 is $F_{vco}=F_{minv}$ when $V_{dd}=V_{ddmin}$ and when the value used to generate the transconductance control signals is the target value, FineControlTgt. The clock frequency of the VCO 200 is $F_{vco}=F_{minv1}$ when $V_{dd}=V_{ddmin}$ and when the value used to generate the transconductance control signals is the minimum value, FineControlMin.

Alternatively, the clock frequency of the VCO 200 can also be reduced from $F_{minv}$ to $F_{minv1}$ by using the switch control signals. In fact, the switch control signals will have to be used if the inverters 206 do not include the transconductance control inputs 210 (e.g., if the ring oscillator components are based on simple digital inverters). If the inverters 206 include the transconductance control inputs 210, the switch control signals are mainly used to adjust the variable capacitors 208 to compensate for process variation.

The clock frequency of the VCO 200 can be controlled within a finite range using the transconductance control signals. In some applications, the CPU speed needs to be lowered further when the system does not need a lot of CPU resources. The clock frequency of the VCO 200 can be reduced below $F_{minv1}$ by changing the capacitance of the variable capacitors 208 using the switch control signals. Alternatively, the clock frequency of the VCO 200 can be reduced below $F_{minv1}$ by using clock gating control on the output of the VCO 200.

As long as the clock frequency is significantly (say 20%) lower than a maximum frequency the CPU 102 can operate under the supplied controlled input (e.g., $V_{supply}=V_{ddmin}$), clock gating control can be used to reduce power consumption without encroaching on CPU setup time requirements. The clock gating logic can provide a large frequency adjustment range of say more than 1:1/100, for example. The clock gating logic can use a numerically control digital oscillator (NCO) having sufficient resolution to provide the large frequency adjustment range.

Figure 5:
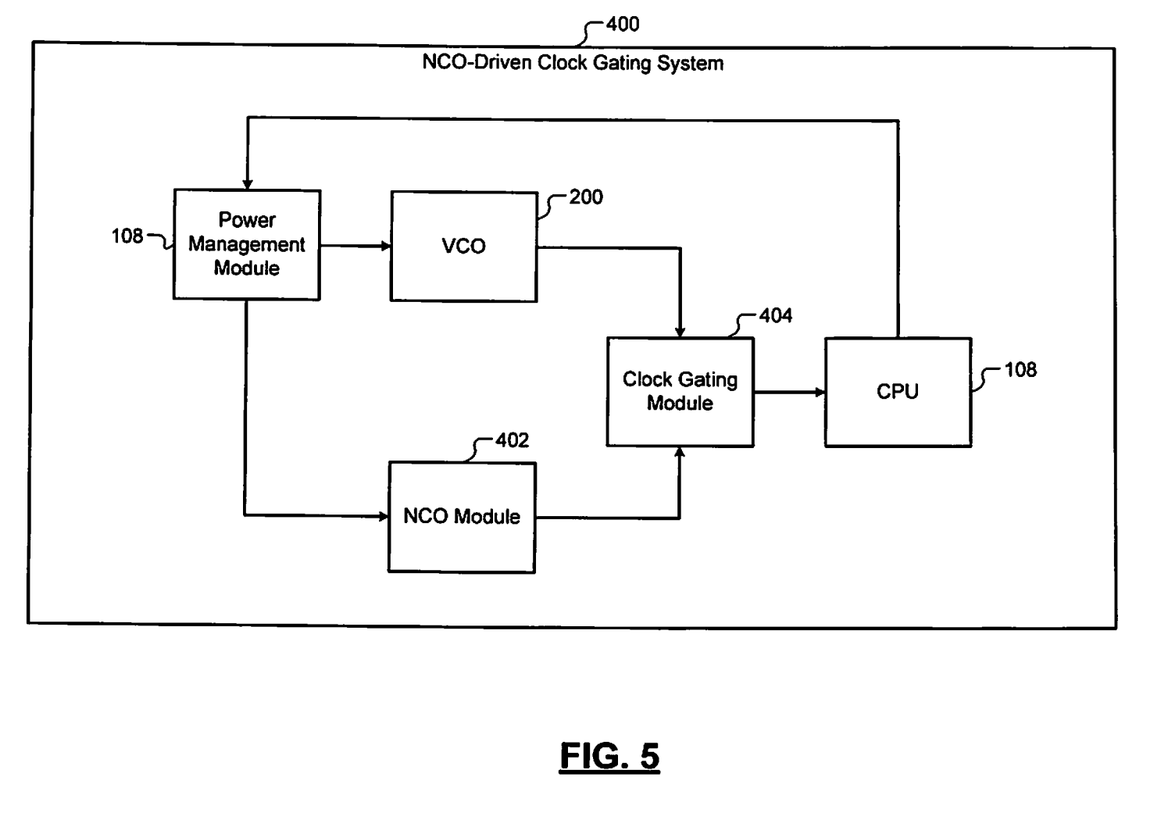
FIG. 5 is a functional block diagram of a clock gating system according to the present disclosure.

Referring now to FIG. 5, an example of an NCO-driven clock gating system 400 is shown. The system 400 includes the CPU 102, the power management module 108, the VCO 200, an NCO module 402, and a clock gating module 404. As explained below, the power management module 108 controls the NCO module 402. Based on inputs received from the power management module 108, the NCO module 402 varies the clock frequency beyond the frequency range handled by the controlled inputs $V_{supply}$, the transconductance control signals, and the switch control signals. The clock gating module 404 gates the clock signal to the CPU 102 according to the output of the NCO module 402.

For example only, the system 400 can provide a frequency adjustment range of 1:1/256 as follows. Suppose $F_{minv1}=1$ GHz, IdleCountInterval=16384 (16.4 us @ 1 GHz), and that the NCO has a resolution of 8 bits (i.e., 256 levels) and 6 bits fractional. In other words, suppose that the power management module 108 reduces the clock frequency to 1 GHz using one or more of the controlled inputs (e.g., by adjusting the supply voltage of the VCO 200 to $V_{ddmin}$). Suppose also that the activity monitoring module 110 counts the number of CPU WFI states during 16384 clock cycles and indicates to the power management module 108 whether the number of CPU WFI states is <10 (SpeedUpThreshold) or >20 (SlowDownThreshold), for example. Suppose further that the power management module 108 outputs 8-bits to the NCO module 402 to update (increase or decrease) an NCO frequency.

The 8-bits can update (increase or decrease) the NCO frequency, depending on whether the number of WFI states in the IdleCountInterval is <10 or >20, as follows. For frequency in 1:1/16 range, the NCO frequency is updated by a fixed amount=$1/512$ of NCO full scale in every $1/4^{th}$ or $1/8^{th}$ IdleCountInterval. The updating will change the clock frequency by about 0.8% or 1.6% every IdleCountInterval. Accordingly, the clock frequency can be changed from 1× to $1/16$× in about 5.8 ms or 2.9 ms.

For frequency in 1/16:1/256 range, the NCO frequency is updated by a fixed amount=$1/512$ of NCO full scale in every IdleCountInterval*16/4 or IdleCountInterval*16/8 clock cycles. The interval selected is the longest interval used in the previous (1:1/16) range. Using this strategy, the clock frequency can be changed from 1× to $1/256$× in less than 10 ms.

Ranges other than those described in the above example may be used. Additional or fewer ranges than those described in the above example may be used. System performance can be further improved if a rate of increasing the clock frequency is greater than a rate of decreasing the clock frequency. Accordingly, the power management module 108 may select a per-step increment value to input to the NCO module 402 to be larger than a per-step decrement value to input to the NCO module 402.

Figure 6:
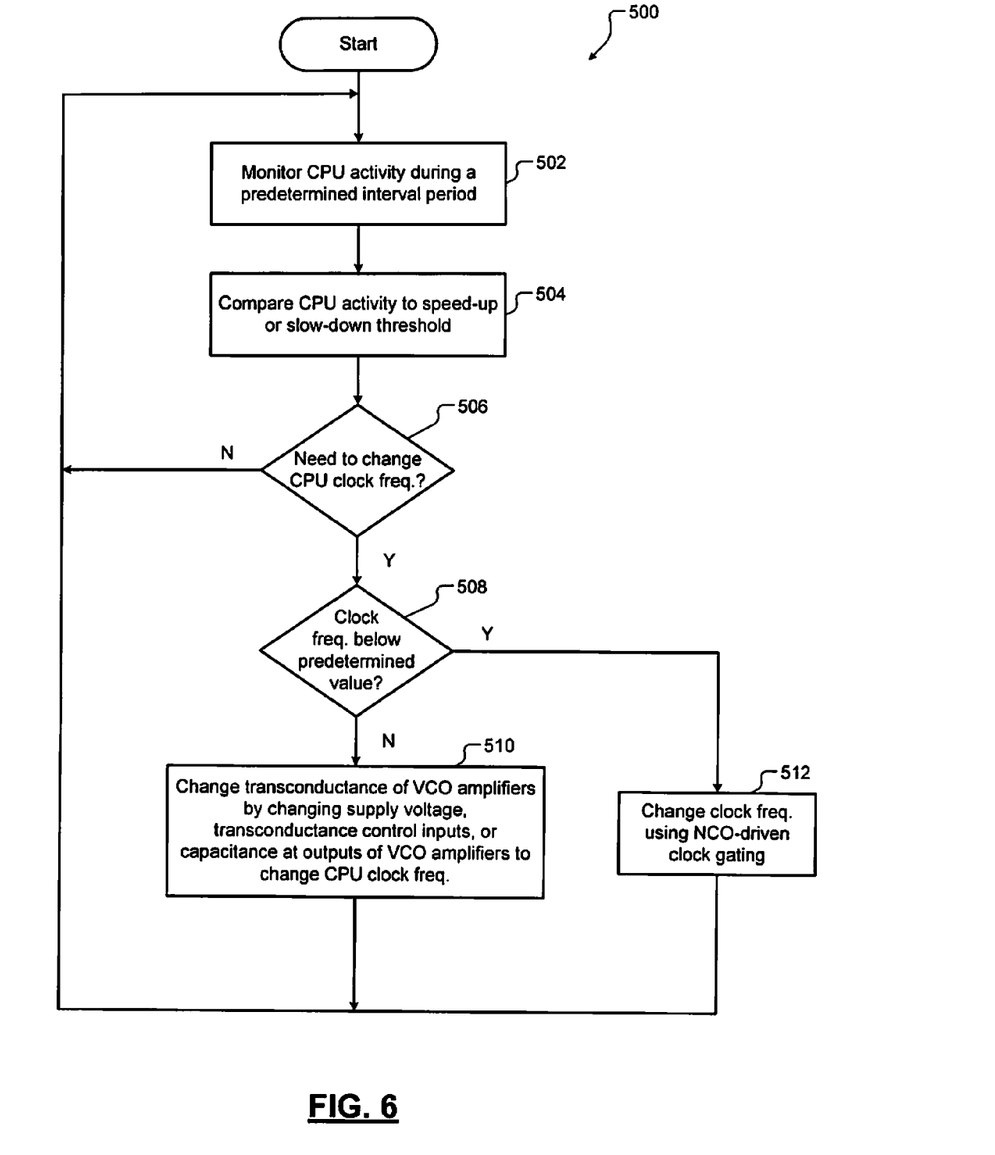
FIG. 6 is a flowchart of a method for controlling clock frequency of a processor according to the present disclosure.

Referring now to FIG. 6, a method 500 for controlling the clock frequency of a CPU is shown. At 502, control monitors CPU activity during a predetermined period. At 504, control compares the CPU activity to a speed-up threshold or a slow-down threshold. At 506, control determines, based on the comparison, whether the clock frequency needs to be changed. Control returns to 502 if, based on the comparison, control determines that the clock frequency of the CPU does not need to be changed.

At 508, if control determines based on the comparison that the clock frequency of the CPU needs to be changed, control determines whether the clock frequency is below a predetermined value (e.g., less than 20% of a maximum value). At 510, if the clock frequency is not below the predetermined value, control changes the transconductance of the amplifiers used in the VCO by changing the supply voltage, transconductance control inputs, and/or capacitance at the outputs of the amplifiers to change the clock frequency. Control returns to 502. At 512, if the clock frequency is below the predetermined value, control changes the clock frequency using an NCO-driven clock gating system. Control returns to 502.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

As used herein, the term module may refer to, be part of, or include an Application Specific Integrated Circuit (ASIC); an electronic circuit; a combinational logic circuit; a field programmable gate array (FPGA); a processor (shared, dedicated, or group) that executes code; other suitable hardware components that provide the described functionality; or a combination of some or all of the above, such as in a system-on-chip. The term module may include memory (shared, dedicated, or group) that stores code executed by the processor.

The term code, as used above, may include software, firmware, and/or microcode, and may refer to programs, routines, functions, classes, and/or objects. The term shared, as used above, means that some or all code from multiple modules may be executed using a single (shared) processor. In addition, some or all code from multiple modules may be stored by a single (shared) memory. The term group, as used above, means that some or all code from a single module may be executed using a group of processors. In addition, some or all code from a single module may be stored using a group of memories.

The apparatuses and methods described herein may be partially or fully implemented by one or more computer programs executed by one or more processors. The computer programs include processor-executable instructions that are stored on at least one non-transitory tangible computer readable medium. The computer programs may also include and/or rely on stored data. Non-limiting examples of the non-transitory tangible computer readable medium include nonvolatile memory, volatile memory, magnetic storage, and optical storage.

What is claimed is:

1. A system comprising:
   a plurality of amplifiers configured to
      generate a clock signal having a frequency,
      wherein the clock signal is input to a processor,
      wherein the amplifiers are connected in series,
      wherein an output of a last one of the amplifiers is fed back to an input of a first one of the amplifiers, and
      wherein each of the amplifiers has a transconductance; and
   a frequency adjustment module configured to adjust, based on an activity level of the processor, the frequency of the clock signal by (i) initially adjusting a supply voltage of the plurality of amplifiers until the supply voltage reaches a minimum or maximum value of a predetermined range, and (ii) subsequent to the supply voltage of the plurality of amplifiers reaching the minimum or maximum value of the predetermined range, adjusting the transconductance of the amplifiers.

2. The system of claim 1, wherein:
   the amplifiers include inverters, and
   the inverters are configured to operate as a ring oscillator.

3. The system of claim 1, further comprising an activity monitoring module configured to determine the activity level of the processor by counting a number of wait-for-interrupt states of the processor within a predetermined time period.

4. The system of claim 3, wherein the frequency adjustment module is configured to:
   compare the number of wait-for-interrupt states to a first threshold and a second threshold, wherein the second threshold is greater than the first threshold,
   increase the frequency of the clock signal in response to the number of wait-for-interrupt states being less than or equal to the first threshold, and
   decrease the frequency of the clock signal in response to the number of wait-for-interrupt states being greater than or equal to the second threshold.

5. The system of claim 1, wherein each of the amplifiers includes an input configured to receive a control signal to adjust the transconductance of the amplifiers, the system further comprising a digital-to-analog converter configured to:
   receive data based on the activity level of the processor, and
   generate, based on the data, the control signal to adjust the transconductance of the amplifiers.

6. The system of claim 1, further comprising:
   a plurality of capacitances and a plurality of switches connected respectively across an output of each of the amplifiers and a common potential, wherein a total capacitance across the output of each of the amplifiers depends on states of the plurality of switches; and
   a capacitor switching module configured to adjust, based on the activity level of the processor, the transconductance of the amplifiers by controlling the states of the switches.

7. The system of claim 6, wherein:
   the frequency adjustment module is configured to adjust the transconductance of the amplifiers by adjusting the supply voltage of the plurality of amplifiers until the supply voltage reaches a predetermined value, and
   the capacitor switching module is configured to adjust the transconductance of the amplifiers after the supply voltage reaches the predetermined value.

8. A system comprising:
   a plurality of amplifiers configured to
      generate a clock signal having a frequency,
      wherein the clock signal is input to a processor,
      wherein the amplifiers are connected in series,
      wherein an output of a last one of the amplifiers is fed back to an input of a first one of the amplifiers, and
      wherein each of the amplifiers has a transconductance;
   a frequency adjustment module configured to adjust, based on an activity level of the processor, the frequency of the clock signal by adjusting the transconductance of the amplifiers, wherein the transconductance of the amplifiers is adjusted by adjusting a supply voltage of the plurality of amplifiers within a predetermined range; and
   a numerically controlled oscillator configured to
      generate a signal, and
      receive, based on the activity level of the processor within a predetermined time period, a plurality of inputs during a plurality of portions of the predetermined time period,
      wherein the inputs adjust a frequency of the signal; and
   a gating module configured to
      receive the signal generated by the numerically controlled oscillator, and
      output the clock signal to the processor in accordance with the signal generated by the numerically controlled oscillator.

9. The system of claim 8, wherein:
   the frequency adjustment module is configured to adjust the transconductance of the amplifiers by adjusting the supply voltage of the plurality of amplifiers until the supply voltage reaches a predetermined value, and
   the numerically controlled oscillator is configured to generate the signal after the supply voltage reaches the predetermined value.

10. A system comprising:
    a plurality of amplifiers configured to
       generate a clock signal having a frequency,
       wherein the clock signal is input to a processor,
       wherein the amplifiers are connected in series,
       wherein an output of a last one of the amplifiers is fed back to an input of a first one of the amplifiers,
       wherein each of the amplifiers has a transconductance, and
       wherein each of the amplifiers includes an input configured to receive a control signal to adjust the transconductance;
    a frequency adjustment module configured to
       adjust, based on an activity level of the processor, the frequency of the clock signal by adjusting the transconductance of the amplifiers,
       wherein the transconductance of the amplifiers is adjusted by adjusting a supply voltage of the plurality of amplifiers until the supply voltage reaches a predetermined value within a predetermined range; and a digital-to-analog converter configured to
  receive data based on the activity level of the processor,
  generate, based on the data, the control signal to adjust the transconductance of the amplifiers, and
adjust the transconductance of the amplifiers after the supply voltage reaches the predetermined value.

11. A system comprising:
a ring oscillator including a plurality of inverters configured to
  generate a clock signal having a frequency,
  wherein the clock signal is supplied to a processor, and
  wherein each of the inverters has a transconductance; and
a frequency adjustment module configured to
  receive an activity level of the processor, and
  adjust, based on the activity level of the processor, the frequency of the clock signal by (i) initially adjusting a supply voltage of the plurality of inverters until the supply voltage reaches a minimum or maximum value of a predetermined range, and (ii) subsequent to the supply voltage of the plurality of inverters reaching the minimum or maximum value of the predetermined range, adjusting the transconductance of the inverters.

12. The system of claim 11, wherein each of the inverters includes an input configured to receive a control signal to adjust the transconductance of the inverters, the system further comprising a digital-to-analog converter configured to:
  receive data based on the activity level of the processor, and
  generate, based on the data, the control signal to adjust the transconductance of the inverters.

13. The system of claim 11, further comprising:
a plurality of capacitances and a plurality of switches connected respectively across an output of each of the inverters and a common potential, wherein a total capacitance across the output of each of the inverters depends on states of the plurality of switches; and
a capacitor switching module configured to adjust, based on the activity level of the processor, the transconductance of the inverters by controlling the states of the switches.

14. A system comprising:
a ring oscillator including a plurality of inverters configured to
  generate a clock signal having a frequency,
  wherein the clock signal is supplied to a processor, and
  wherein each of the inverters has a transconductance;
a frequency adjustment module configured to
  receive an activity level of the processor, and
  adjust, based on the activity level of the processor, the frequency of the clock signal by adjusting the transconductance of the inverters,
  wherein the transconductance of the inverters is adjusted by adjusting a supply voltage of the plurality of inverters within a predetermined range; and
a numerically controlled oscillator configured to
  generate a signal, and
  receive, based on the activity level of the processor within a predetermined time period, a plurality of inputs during a plurality of portions of the predetermined time period,
  wherein the inputs adjust a frequency of the signal; and
a gating module configured to
  receive the signal generated by the numerically controlled oscillator, and
  output the clock signal to the processor in accordance with the signal generated by the numerically controlled oscillator.

15. A method comprising:
generating a clock signal for a processor using a plurality of inverters connected in series, wherein the clock signal has a frequency, and wherein each of the inverters has a transconductance;
receiving an activity level of the processor; and
adjusting, based on the activity level of the processor, the frequency of the clock signal by (i) initially adjusting a supply voltage of the plurality of inverters until the supply voltage reaches a minimum or maximum value of a predetermined range, and (ii) subsequent to the supply voltage of the plurality of inverters reaching the minimum or maximum value of the predetermined range, adjusting the transconductance of the inverters.

16. The method of claim 15, further comprising:
converting data indicating the activity level of the processor to a control signal; and
adjusting the transconductance of the inverters by supplying the control signal to an input of each of the inverters,
wherein the input of each of the inverters is configured to receive the control signal to adjust the transconductance of the respective inverter.

17. The method of claim 15, further comprising:
connecting a plurality of capacitances and a plurality of switches respectively across an output of each of the inverters and a common potential, wherein a total capacitance across the output of each of the inverters depends on states of the plurality of switches; and
adjusting, based on the activity level of the processor, the transconductance of the inverters by controlling the states of the switches.

18. A method comprising:
generating a clock signal for a processor using a plurality of inverters connected in series, wherein the clock signal has a frequency, and wherein each of the inverters has a transconductance;
receiving an activity level of the processor;
adjusting, based on the activity level of the processor, the frequency of the clock signal by adjusting the transconductance of the inverters, wherein the transconductance of the inverters is adjusted by adjusting a supply voltage of the plurality of inverters within a predetermined range;
generating a signal using a numerically controlled oscillator;
receiving, based on the activity level of the processor within a predetermined time period, a plurality of inputs during a plurality of portions of the predetermined time period, wherein the inputs adjust a frequency of the signal; and
outputting the clock signal to the processor in accordance with the signal generated by the numerically controlled oscillator.

* * * * *